United States Patent [19]

Okanobu

[11] 4,318,050
[45] Mar. 2, 1982

[54] AM DETECTING CIRCUIT

[75] Inventor: Taiwa Okanobu, Tokyo, Japan

[73] Assignee: Sony Corporation, Tokyo, Japan

[21] Appl. No.: 126,018

[22] Filed: Feb. 29, 1980

[30] Foreign Application Priority Data

Mar. 2, 1979 [JP] Japan ................. 54-246697

[51] Int. Cl.³ .................... H03D 1/06; H03D 1/18
[52] U.S. Cl. .................... 329/101; 329/163; 329/166; 329/169
[58] Field of Search ............ 329/101, 163, 166, 168, 329/169; 455/201–204, 337

[56] References Cited

U.S. PATENT DOCUMENTS 3,517,267 6/1970 Ferrieu ..................... 329/169 X
3,857,047 12/1974 Knight ..................... 329/101 X
3,965,435 6/1976 Kriedt et al. ................ 329/101

Primary Examiner—Siegfried H. Grimm
Attorney, Agent, or Firm—Lewis H. Eslinger; Alvin Sinderbrand

[57] ABSTRACT

A single-ended push-pull amplifier converts a single-ended input into a balanced signal which, after amplification, is fed to the bases of alternately operating transistors, and the resulting inverted, or out-of-phase output currents of the inverting transistors are fed back to almost exactly equal the signal current fed to the amplifier. The base drives required to produce such fed-back currents are also fed to the bases of output driver circuit transistors where a full-wave rectified replica of the input signal is produced.

3 Claims, 3 Drawing Figures

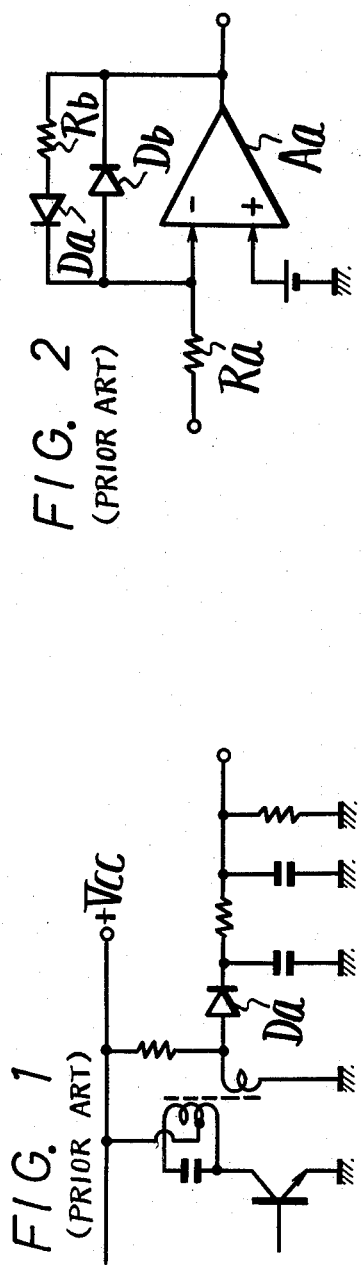
FIG. 1 (PRIOR ART)
FIG. 2 (PRIOR ART)
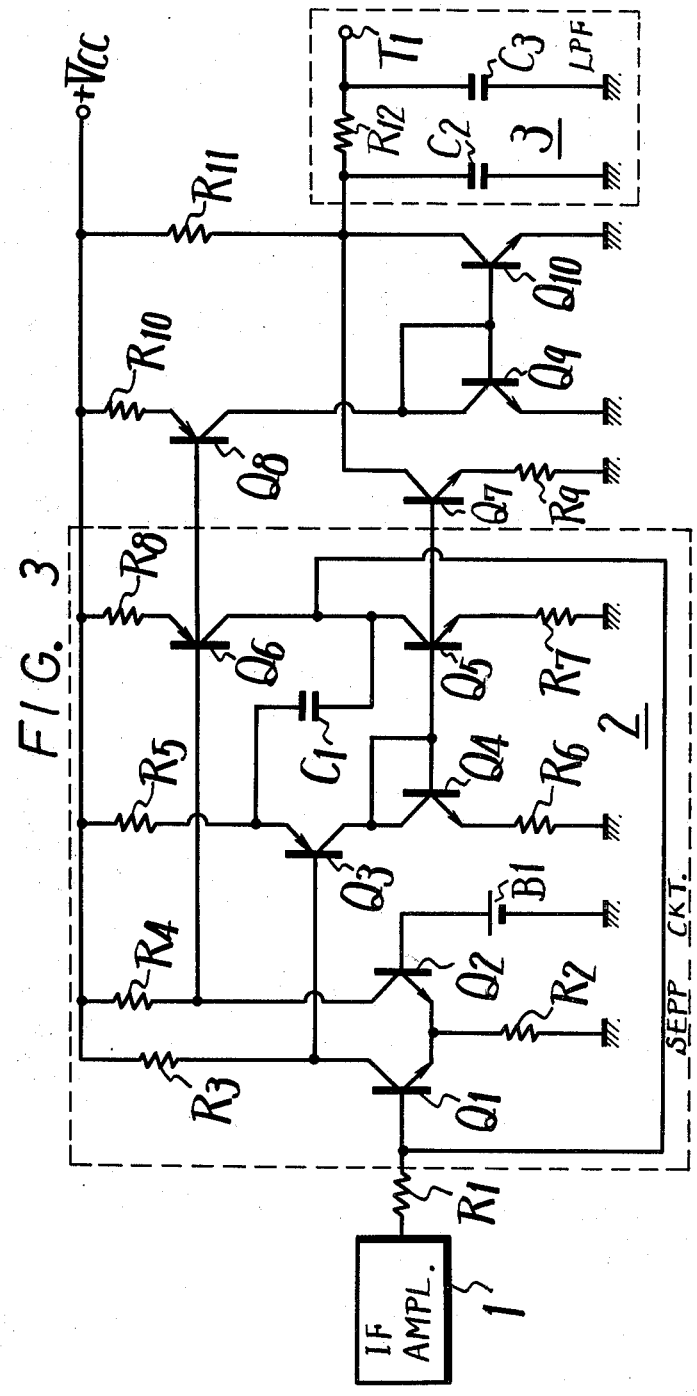
FIG. 3

ABSTRACT# AM DETECTING CIRCUIT

BACKGROUND OF THE INVENTION

The present invention generally relates to detecting circuits and more particularly to an AM detecting circuit having improved linearity under small-signal conditions.

One type of detector commonly used in the prior art employs a series detector diode in which an intermediate signal is half-wave detected. As is well known, detector diodes have barrier voltages on the order of 0.2 to 0.6 volts. When an intermediate frequency signal having a voltage lower than this barrier voltage is applied to the diode, no response is produced and, when the barrier voltage is a significant fraction of the signal voltage, detection is performed but it is accompanied by distortion. To avoid distortion, such signal voltages should preferably be above 120 dB$\mu$ (=1V). In systems employing high circuit voltages, the relatively small barrier voltage is unimportant. However, in portable or battery-operated equipment wherein the highest supply voltage is only on the order of a few volts, it is difficult to provide a signal voltage with a high enough level to provide detection without distortion.

Other proposed detectors have employed an operational amplifier with a pair of oppositely poled diodes in parallel in a feedback path with a resistance in series with one of the diodes. Although this improved the level of signal detection, the lack of provision in such a circuit for applying a bias to the diodes still permits distortion to occur during small signal conditions.

OBJECTS AND SUMMARY OF THE INVENTION

Accordingly, it is an object of the present invention to provide a novel AM detecting circuit free from the defects of the prior art.

It is another object of the present invention to provide an AM detecting circuit which can perform AM detection with lower distortion even with small signal voltages.

A further object of the invention is to provide an AM detecting circuit which can be easily fabricated as an integrated circuit.

A still further object of the invention is to provide an AM detecting circuit for use with a receiver.

A still further object of the invention is to provide an AM detector which reduces distortion by eliminating diagonal clipping or envelope distortion typically caused by diode detection.

According to an aspect of the invention, there is provided an AM detecting circuit for detecting an AM signal having first and second polarities from a single-ended source, comprising means for alternately producing a first drive signal when the AM signal has the first polarity and a second drive signal when the AM signal has the second polarity, at least first and second class B amplifiers for separately amplifying the first and second drive signals for application to the means for alternately producing, and means responsive to at least one of the first and seconthe following description read in conjunction with the accompanying drawings in which like reference numerals designate the same elements.

BRIEF DESCRIPTION OF THE DRAWINGS

FIGS. 1 and 2 are schematic diagrams of AM detecting circuits according to the prior art; and FIG. 3 is a schematic diagram of an AM detecting circuit according to an embodiment of the present invention.

DETAILED DESCRIPTION OF THE PREFERRED EMBODIMENT

Before beginning the description of the present invention, a brief discussion of diode detectors of the prior art is included for improved understanding of the subject matter.

FIG. 1 shows a detector diode $D_A$ in series between an intermediate frequency amplifier and a filter. As previously explained, detector diodes have a barrier voltage which can produce distortion when used with low input signal levels.

FIG. 2 shows a detector employing an operational amplifier $A_a$ which is fed an intermediate frequency signal through an input resistor $R_a$ at its negative input and has oppositely poled diodes $D_A$ and $D_B$ connected in parallel in a feedback path from its output to its negative input. A load resistor $R_b$ is in series with diode $D_a$. Diode $D_a$ is turned ON during negative half cycles of the intermediate frequency signal to produce a gain in operational amplifier $A_a$ equal to $R_b/R_a$. Thus, during negative half cycles of the intermediate frequency signal, an output is delivered to succeeding circuits. During positive half cycles, diode $D_b$ is turned ON and the gain of operational amplifier $A_a$ is 0. Thus, the positive half cycle of the intermediate frequency signal is cut off. In this way, half wave rectification of the intermediate frequency signal is performed.

Referring now to the embodiment of the invention shown in FIG. 3, a conventional intermediate frequency amplifier 1 is shown to provide an intermediate frequency signal through a resistor R1 to a single-ended push-pull amplifier 2. Generally speaking, single-ended push-pull amplifier 2 converts a single-ended AM intermediate frequency signal from conventional intermediate frequency amplifier 1 into a balanced signal and amplifies the balanced components in class B amplifiers to produce complementary half-wave rectified signals which are 100% fed back to the input. The base drive signals which are used to produce the fedback signals are separately amplified in output transistors and filtered in a low pass filter 3 to produce a full-wave detected output.

More particularly, in the illustrated embodiment, a differential amplifier consisting of transistors $Q_1$ and $Q_2$ converts the unbalanced input applied from resistor R1 to the base of transistor $Q_1$ into balanced outputs which are applied to the bases of transistors $Q_3$ and $Q_6$, respectively. The emitters of transistors $Q_1$ and $Q_2$ are connected through a resistor R2 to ground. The collectors of transistors $Q_1$ and $Q_2$ are individually connected through resistors R3 and R4, respectively, to a positive supply voltage $+V_{cc}$. A constant voltage supply, such as for example, a battery B1, is connected between ground and the base of transistor $Q_2$.

The emitter of transistor $Q_3$ is connected through a resistor R5 to supply voltage $+V_{cc}$. The collector of transistor $Q_3$ is connected to a current mirror circuit consisting of transistors $Q_4$ and $Q_5$. The collector of transistor $Q_4$ and the bases of transistors $Q_4$ and $Q_5$ are connected together. The emitters of transistors $Q_4$ and $Q_5$ are connected through resistors R6 and R7, respectively, to ground. A capacitor C1 is connected between the emitter of transistor $Q_3$ and the collector of transistor $Q_5$ for phase correction to prevent oscillation.

The output at the collector of transistor $Q_2$ of the differential amplifier is applied to the bases of transistors $Q_6$ and $Q_8$. The emitters of transistors $Q_6$ and $Q_8$ are connected through resistors R8 and R10, respectively, to supply voltage $+V_{cc}$. The collector of transistor $Q_6$ is connected to the collector of transistor $Q_5$, and the signal at the junction of these collectors is fed back to the base of transistor $Q_1$. The collector of transistor $Q_8$ is connected to the collector of a transistor $Q_9$ in another current mirror circuit consisting of transistors $Q_9$ and $Q_{10}$ and also to the bases of transistors $Q_9$ and $Q_{10}$. The emitters of transistors $Q_9$ and $Q_{10}$ are connected to ground. The output at the collector of transistor $Q_{10}$ is connected through a resistor R11 to supply voltage $+V_{cc}$ and to low pass filter 3 consisting of filter capacitors C2 and C3 and to low pass filter 3. The output of low pass filter 3 is fed to an output terminal T1.

Transistors $Q_7$ and $Q_8$ are selected to operate under the same conditions as transistors $Q_5$ and $Q_6$. In addition, transistors $Q_3$-$Q_{10}$ are biased to operate as class B amplifiers.

Transistors $Q_1$ to $Q_6$ operate as an amplifier having 100% negative feedback. An intermediate frequency signal current i fed through resistor R1 to single-ended push-pull (SEPP) amplifier 2 is approximately equal to $i \simeq e/R1$ where e=signal voltage. Signal circuit i is divided into a collector current $i_c$ for transistor $Q_5$ and $Q_6$ and a small error current $i_e$ flowing to the base of differential amplifier transistor $Q_1$. When the signal current i increases a small amount, the error current $i_e$ increases the precise amount required to increase collector current $i_c$ sufficiently to approximately equal the increase in signal current i. If, for example, the open loop current gain of the amplifier is 1000, an increase in signal current i of 1 ma requires only an increase in error current $i_e$ of 1 μa. In this way, the input impedance of SEPP amplifier 2 is approximately zero.

During the positive half cycle of the intermediate frequency signal from intermediate frequency amplifier 1, the collector current of transistor $Q_1$ increases and that of transistor $Q_2$ decreases. Since transistor $Q_6$ is biased to operate as a class B amplifier, such decrease turns OFF transistor $Q_6$. As the collector current of transistor $Q_1$ increases during the positive half cycle of the intermediate frequency signal, collector current flows through transistor $Q_3$ in proportion to the amplitude of the applied signal. The collector from transistor $Q_3$ is applied to transistors $Q_4$ and $Q_5$. At this time, however, transistor $Q_6$ is OFF and the positive half cycle of the intermediate frequency signal current i from intermediate frequency amplifier 1 is employed to provide collector current to transistor $Q_5$.

During the negative half cycle of the intermediate frequency signal, the collector current of transistor $Q_1$ decreases thus turning OFF transistor $Q_3$. This, in turn, turns OFF transistors $Q_4$ and $Q_5$. Also at this time, the collector current of transistor $Q_2$ increases and produces collector current in transistor $Q_6$. Since transistor $Q_5$ is OFF at this time, collector current for transistor $Q_6$ is provided from the intermediate frequency input signal current i through resistor R1.

The base drive signals which are applied to the bases of transistors $Q_5$ and $Q_6$ to produce the equivalent of the positive and negative halves of the signal current i at their respective collectors are also applied to the bases of transistors $Q_7$ and $Q_8$, respectively. Transistors $Q_7$ and $Q_8$ are selected and biased to have the same response to base drive as do transistors $Q_5$ and $Q_6$. Therefore, the collectors of transistors $Q_7$ and $Q_8$ provide full wave rectified currents equal to the positive and negative half cycles of the intermediate frequency current i from resistor R1. The current mirror circuit consisting of transistors $Q_9$ and $Q_{10}$ produces a signal at the collector of transistor $Q_{10}$ having the same current as the collector current of transistor $Q_8$.

The resulting full wave rectified signal from transistors $Q_7$ and $Q_{10}$ is fed through low pass filter 3 to output terminal T1. Due to the full-wave rectification, the carrier component in the signal fed to low pass filter 3 has twice the frequency of that in the output of a half-wave rectifier. This simplifies filtering of the carrier component and permits selection of, for example, a more desirable time constant in low pass filter 3.

The availability of the output in the form of a current signal from transistors $Q_7$ and $Q_{10}$ increases design freedom for following stages.

An AM detector according to the present invention produces distortion less than 0.5% even when the signal level is 80 to 100 dBμ.

Although an input resistor R1 is shown, in some cases the output impedance of intermediate frequency amplifier 1 may be sufficient to permit omission of input resistor R1.

Having described a specific preferred embodiment of the invention with reference to the accompanying drawing, it is to be understood that the invention is not limited to that precise embodiment, and that various changes and modifications may be effected therein by one skilled in the art without departing from the scope or spirit of the invention as defined in the appended claims.

What is claimed is:

1. An AM detecting circuit for detecting an AM signal having first and second polarities from a single-ended source comprising:
   means for alternately producing a first drive signal when said AM signal has said first polarity and a second drive signal when said AM signal has said second polarity;
   at least first and second class B amplifiers for separately amplifying said first and second drive signals to produce a negative feedback signal for application to said means for alternately producing; and
   means responsive to at least one of said drive signals for producing a detected output.

2. A circuit according to claim 1; wherein said means responsive to at least one of said drive signals includes a third transistor responsive to said first drive signal to produce a first half-wave rectified signal and a fourth transistor responsive to said second drive signal to produce a second half-wave rectified signal, and means for combining said first and second half-wave rectified signals into a full-wave rectified signal.

3. A circuit according to claim 1; wherein said means for alternately producing first and second balanced drive signals includes a differential amplifier.

* * * * *